United States Patent
Liu et al.

(10) Patent No.: US 8,981,496 B2
(45) Date of Patent: Mar. 17, 2015

(54) METAL GATE AND GATE CONTACT STRUCTURE FOR FINFET

(71) Applicant: Taiwan Semiconductor Manufacturing Company, Ltd., Hsin-Chu (TW)

(72) Inventors: Chi-Wen Liu, Hsin-Chu (TW); Chao-Hsiung Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/779,156

(22) Filed: Feb. 27, 2013

(65) Prior Publication Data

US 2014/0239396 A1     Aug. 28, 2014

(51) Int. Cl.
| | |
|---|---|
| *H01L 21/70* | (2006.01) |
| *H01L 29/78* | (2006.01) |
| *H01L 23/48* | (2006.01) |
| *H01L 21/283* | (2006.01) |
| *H01L 21/8234* | (2006.01) |
| *H01L 27/088* | (2006.01) |
| *H01L 21/28* | (2006.01) |
| *H01L 21/84* | (2006.01) |
| *H01L 29/66* | (2006.01) |
| *H01L 27/12* | (2006.01) |

(52) U.S. Cl.
CPC ............ *H01L 29/785* (2013.01); *H01L 21/283* (2013.01); *H01L 21/823431* (2013.01); *H01L 27/0886* (2013.01); *H01L 21/28008* (2013.01); *H01L 21/845* (2013.01); *H01L 29/66545* (2013.01); *H01L 27/1211* (2013.01)
USPC ........... 257/407; 257/412; 257/751; 257/760; 438/157; 438/283

(58) Field of Classification Search
CPC ............ H01L 29/66795; H01L 29/785; H01L 29/66545; H01L 21/745; H01L 27/0886; H01L 2029/7858; H01L 21/823431; H01L 21/823487; H01L 21/823821
USPC .......... 257/328, 407, 412, 751, 760, E29.267; 438/157, 283
See application file for complete search history.

(56) References Cited

U.S. PATENT DOCUMENTS

| | | | |
|---|---|---|---|
| 7,442,590 B2 | 10/2008 | Orlowski | |
| 2005/0020020 A1* | 1/2005 | Collaert et al. | 438/300 |
| 2006/0175669 A1 | 8/2006 | Kim et al. | |
| 2010/0328022 A1* | 12/2010 | Fan et al. | 338/309 |
| 2012/0001266 A1* | 1/2012 | Lim et al. | 257/369 |
| 2012/0196425 A1* | 8/2012 | Scheiper et al. | 438/400 |
| 2012/0205727 A1* | 8/2012 | Kanakasabapathy et al. | 257/288 |
| 2012/0241863 A1* | 9/2012 | Tsai et al. | 257/347 |
| 2013/0181299 A1* | 7/2013 | Baldauf et al. | 257/401 |

FOREIGN PATENT DOCUMENTS

| | | |
|---|---|---|
| KR | 10-0585178 | 5/2006 |
| KR | 10-2009-0005066 | 1/2009 |

* cited by examiner

*Primary Examiner* — Chuong A Luu
*Assistant Examiner* — Cory Eskridge
(74) *Attorney, Agent, or Firm* — Slater & Matsil, L.L.P.

(57) ABSTRACT

An embodiment includes a substrate, wherein a portion of the substrate extends upwards, forming a fin, a gate dielectric over a top surface and sidewalls of the fin, a liner overlaying the gate dielectric, and an uninterrupted metallic feature over the liner a portion of the liner overlaying the gate dielectric, wherein the liner extends from a top surface of the uninterrupted metallic feature and covers sidewalls of the metallic feature, and wherein the gate dielectric, liner, and uninterrupted metallic feature collectively form a gate, a gate contact barrier, and a gate contact.

20 Claims, 5 Drawing Sheets

METAL GATE AND GATE CONTACT STRUCTURE FOR FINFET

BACKGROUND

With the increasing down-scaling of integrated circuits (IC) and increasingly demanding requirements to the speed of ICs, transistors need to have higher drive currents with increasingly smaller dimensions. Fin field-effect transistors (FinFET) were thus developed. In a typical finFET, portions of a substrate are etched away to create a vertical fin structure. This vertical fin structure is used to form source/drain regions in the lateral direction, forming a channel region in the fin. A gate is formed over the channel region of the fin in the vertical direction forming a finFET. Subsequently, an inter-layer dielectric (ILD) and a plurality of interconnect layers may be formed over the finFET. The ILD includes gate contacts electrically connecting the gate to other active components in the IC through the plurality of interconnect layers.

An issue with existing finFETs is high contact resistance. For example, a typical gate may include a gate dielectric and a gate electrode over the gate dielectric. The gate electrode in a finFET includes a work function metal layer that allows the finFET to induce a charge in the channel region (i.e., the fin) when an appropriate bias voltage is applied. Unfortunately, the contact resistance of the work function metal is relatively high. The gate contact may also include a high-resistance, for example, diffusion barrier layer covering the bottom surface and sidewalls of the contact. The inclusion of the work function metal and the diffusion barrier layer is a factor in proper finFET functionality. However, the relatively high contact resistance of these layers compound and may cause undesirably high contact resistance in the device.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Embodiments of integrated circuits (IC) structure will be described with respect to a specific context, namely a fin field-effect transistor (finFET). Other transistor structures (such as tunnel field-effect transistor or nano-wire field-effect transistor) and analogous structures are within the contemplated scope of the disclosure. The finFET may be included in a microprocessor, memory cell, and/or other integrated circuit (IC).

FIGS. 1-10 illustrate cross-sectional views of various stages of manufacture of an integrated circuits (IC) structure 100 in accordance with various embodiments, wherein the cross-sectional view is made crossing a fin rather than any source/drain regions. As employed in the present disclosure, the term integrated circuits (IC) structure 100 refers to a fin field effect transistor (finFET) 100. FinFET 100 refers to any fin-based, multi-gate transistor. FinFET 100 is first formed with a dummy gate over a gate dielectric. An inter-layer dielectric (ILD) is formed over finFET 100 and patterned to expose the dummy gate. The dummy gate is then removed. A barrier layer is subsequently formed to cover the gate dielectric and the sidewalls of the ILD. The patterned opening of the ILD is filled, simultaneously completing a gate structure and forming a gate contact. The barrier layer acts as both a contact barrier layer and a work function metal. Therefore, one of the high-resistance layers in the gate structure is eliminated, reducing overall contact resistance in the device.

Figure 1:
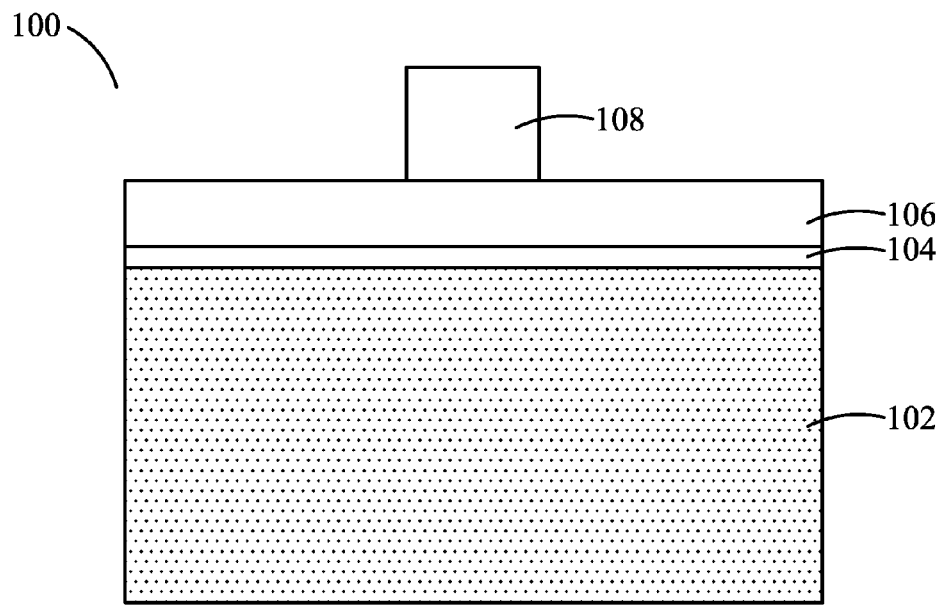
FIGS. 1-10 are cross-sectional views of intermediate stages of manufacture of an integrated circuits (IC) structure in accordance with various embodiments.

FIG. 1 illustrates a cross-sectional view of a finFET 100, which includes substrate 102. Substrate 102 may be a bulk substrate or a semiconductor-on-insulator (SOI) substrate. Substrate 102 may be formed of silicon or silicon germanium, although other semiconductor materials, including group III, group IV, and group V elements, may also be used.

Buffer layer 104 and mask 106 may be formed on substrate 102. Buffer layer 104 may be formed of silicon oxide using, for example, a thermal oxidation process. Buffer layer 104 may act as an adhesion layer and reduces strain between substrate 102 and mask 106. Buffer layer 104 may further act as an etch stop layer for etching mask 106. Mask 106 may be formed of silicon nitride using, for example, low-pressure chemical vapor deposition (LPCVD), thermal nitridation of silicon, plasma enhanced chemical vapor deposition (PECVD), or plasma anodic nitration. Mask 106 is used as a hard mask during subsequent photolithography processes. Photo resist layer 108 is formed and patterned over mask 106, exposing portions of the underlying mask 106.

Figure 2:
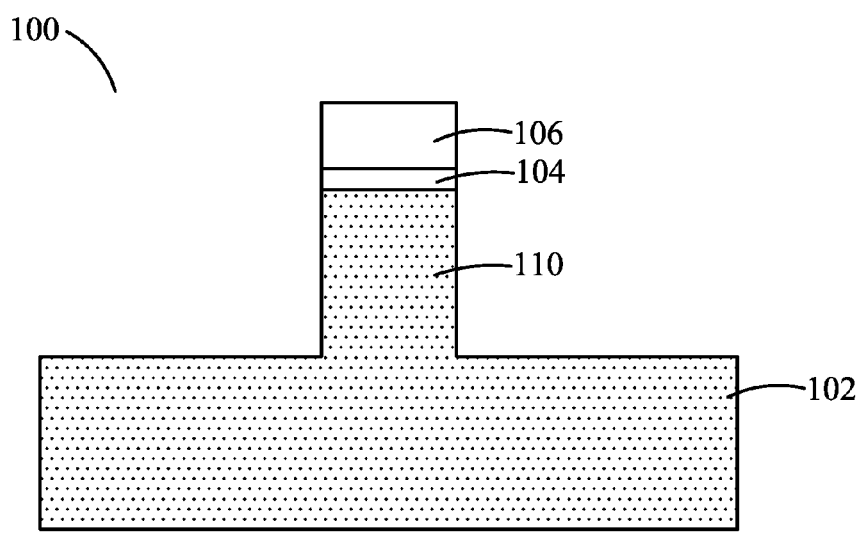

Referring now to FIG. 2, mask 106 and buffer layer 104 are etched through the openings in photo resist layer 108. Substrate 102 is then etched, forming a fin 110. Although only one fin 110 is shown in FIG. 2, alternate embodiments include forming multiple fins in the same process step (e.g., to form a multi-fin finFET or to simultaneously form multiple finFETs). Photo resist layer 108 is subsequently removed. Alternatively, fins may also be formed by depositing an oxide layer (e.g., silicon oxide) over substrate 102, patterning the oxide layer, and epitaxially growing fins.

Figure 3:
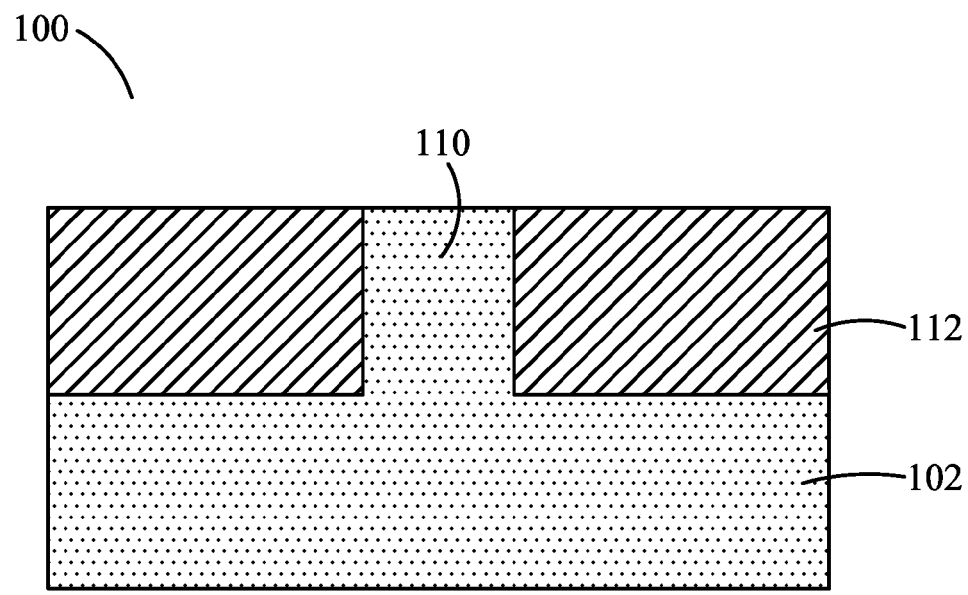

In FIG. 3, dielectric layer 112 is deposited over substrate 102. Dielectric layer 112 may be formed of silicon oxide, although other dielectric materials such as SiN, SiC, or the like may also be used. Dielectric layer 112 may be blanket deposited over substrate 102. In various embodiments including multiple fins, dielectric layer 112 may serve as an isolation layer to isolate individual fins. A chemical-mechanical polish (CMP) is performed on dielectric layer 112 so that the top surface of dielectric layer 112 is level with the top surface of fin 110.

Figure 4:
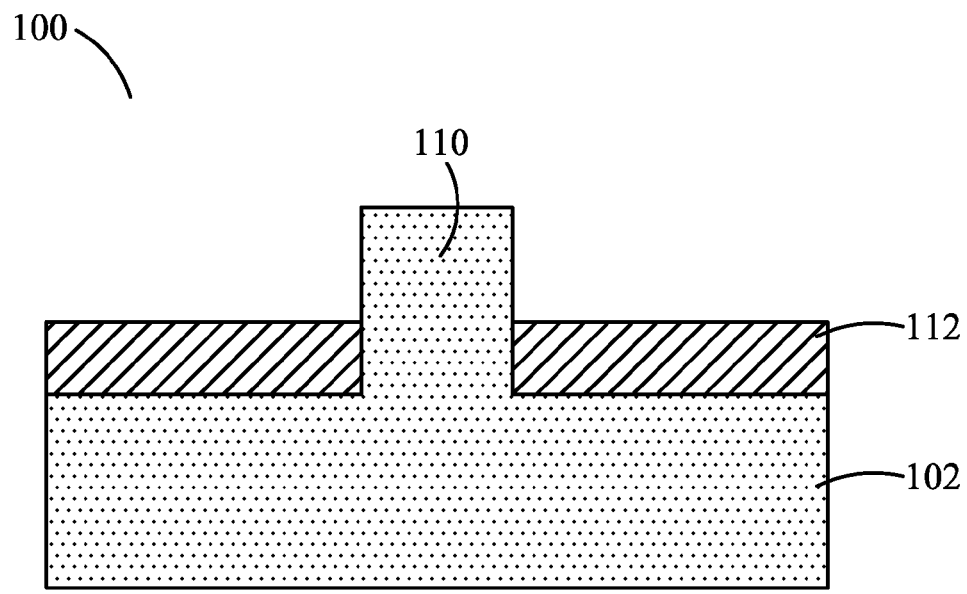

FIG. 4 illustrates the recessing of dielectric layer 112, for example, by etching. As a result of the recessing, a portion of fin 110 is exposed to extend over the top surface of dielectric layer 112. When finFET 100 is fully formed, this portion of fin 110 extending over the top surface of dielectric layer 112 acts as a channel region.

Figure 5:
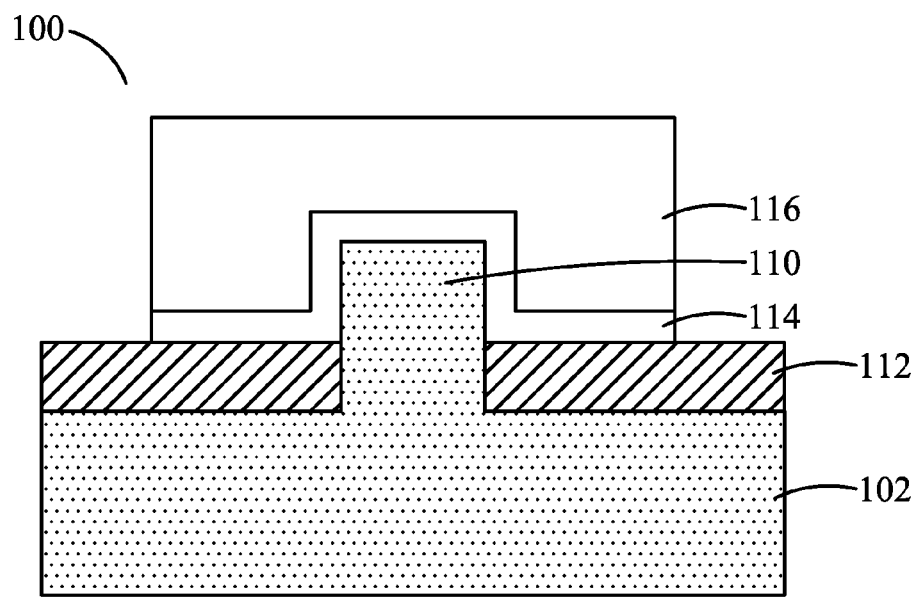

FIG. 5 illustrates the formation of a gate dielectric 114 and dummy gate 116 over fin 110. Gate dielectric 114 may be formed of silicon dioxide, silicon nitride, or a high-k dielectric material, having a k value greater than, for example, about 7.0. The high-k dielectric material may comprise metal oxides. Examples of metal oxides used for high-k dielectric material include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In some embodiments, gate dielectric 114 has a thickness in the range of about 5 Å to about 30 Å. The gate dielectric may be formed on the top surface and sidewalls of fin 110 through a thermal oxidation method, or it may be blanket deposited over fin 110. In alternative embodiments, an interfacial layer (not shown) may also be formed between fin 110 and gate dielectric 114. The interfacial layer may include silicon oxide and acts as a glue/buffer layer between gate dielectric 114 and substrate 102. Dummy gate 116 is formed over gate dielectric 114. Dummy gate 116 may be formed of poly-silicon, amorphous silicon, or the like. Notably, a work function metal layer is not formed with gate dielectric 114 and dummy gate 116.

Figure 6:
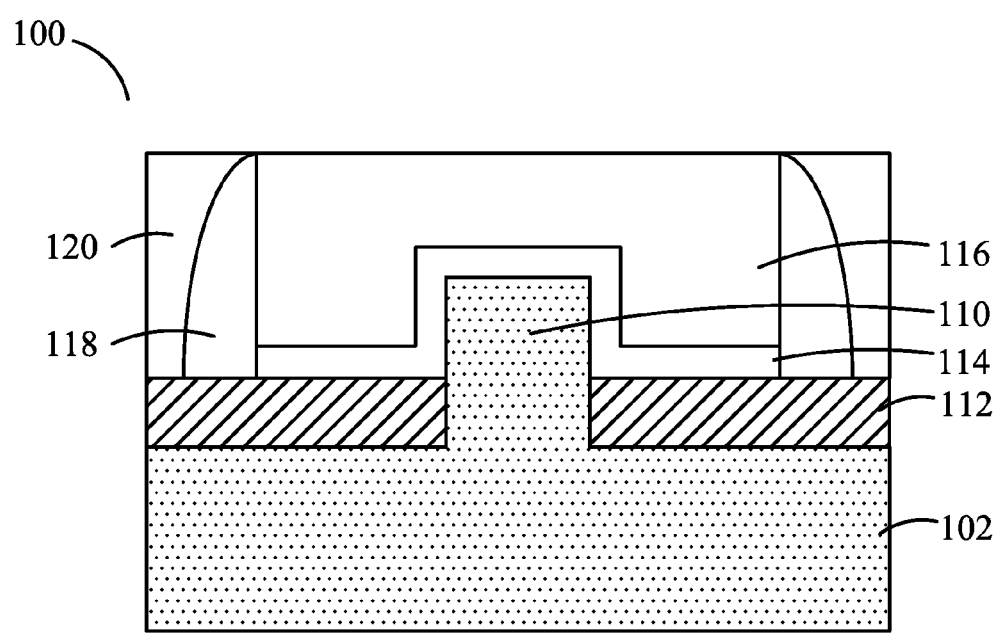

FIG. 6 illustrates the formation of gate spacers 118 and a first inter-layer dielectric (ILD) 120. Gate spacers 118 may be formed of silicon oxide, silicon nitride, and the like. First ILD 120 may be formed of silicon oxide, phosphosilicate glass (PSG), borophosphosilicate glass (BPSG), and the like. First ILD 120 may be blanket deposited over dielectric layer 112 and gate spacers 118. Subsequently, the remaining portions of finFET 100, including source/drain regions and source/drain silicides (not shown) are formed in the lateral direction. The formation processes of these components are well known in the art, and are not included herein.

Figure 7:
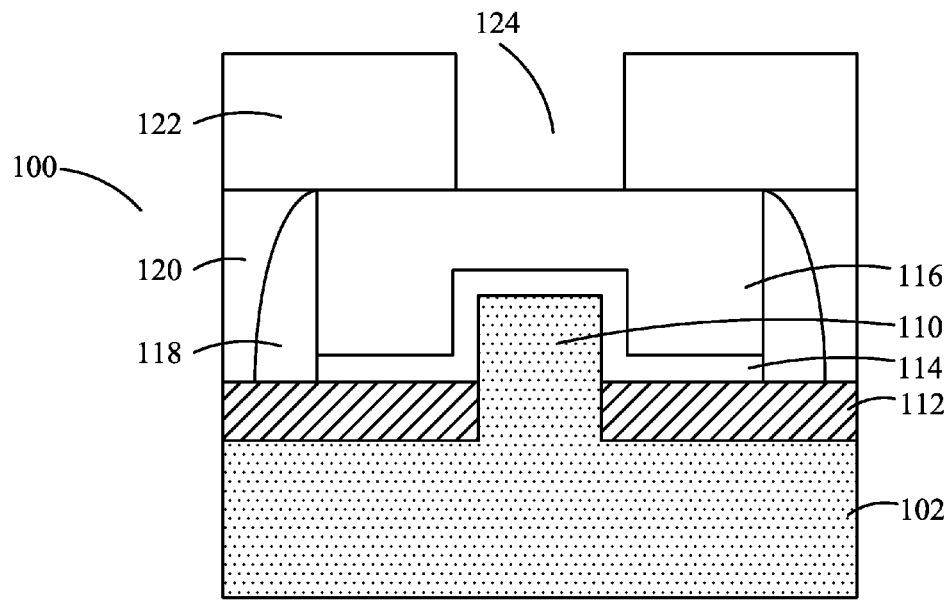

In FIG. 7, a second ILD 122 is formed over first ILD 120, gate spacers 118, and dummy gate 116. Second ILD 122 may be formed of substantially the same material using substantially the same techniques as first ILD 120. Alternatively, second ILD 122 may be formed of a different material than first ILD 120. For example, first ILD 120 may be formed of PSG and second ILD 122 may be formed of silicon oxide. Second ILD 122 is patterned to form an opening 124 exposing the underlying dummy gate 116. Opening 124 may be formed using, for example, a combination of photolithographic and etching techniques.

Figure 8:
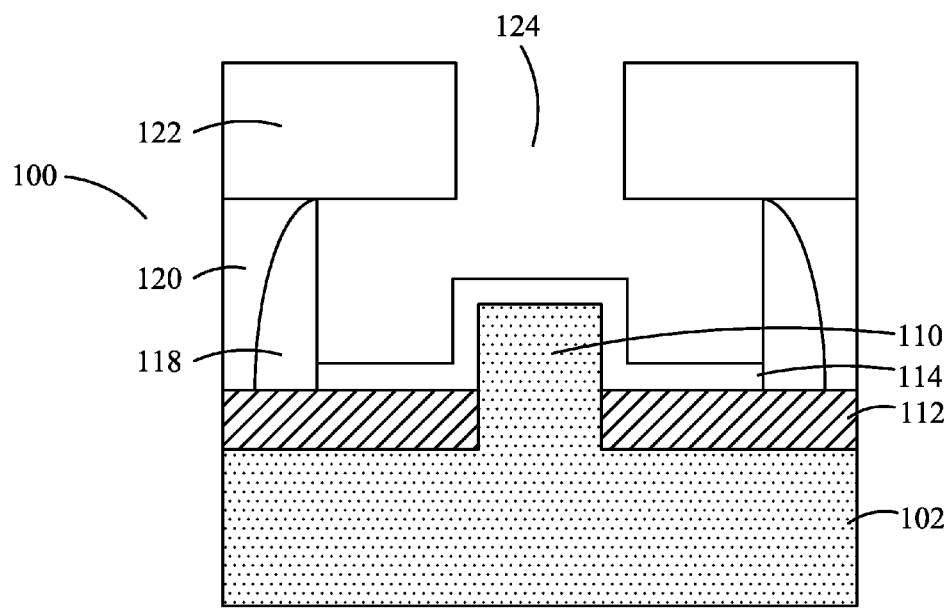

FIG. 8 illustrates the removal of dummy gate 116. Dummy gate 116 may be removed using, for example, a wet etch and/or a dry etch process. In at least one embodiment, a wet etch process for removing dummy gate 116 includes exposure to a hydroxide solution containing ammonium hydroxide, diluted HF, deionized water, and/or other suitable etchant solutions. In other embodiments, a dry etch process for removing dummy gate 116 may be performed under a source power of about 650 to 800 W, a bias power of about 100 to 120 W, and a pressure of about 60 to 200 mTorr, using $Cl_2$, HBr and He as etching gases. In an alternative embodiment, gate dielectric 114 may also be removed with the removal of dummy gate 116. A new gate dielectric may then be re-formed over fin 110 out of substantially the same materials and using substantially the same techniques as previously used to form gate dielectric 114. Opening 124 is thus expanded to include the space previously occupied by dummy gate 116 in ILD 120.

Figure 9:
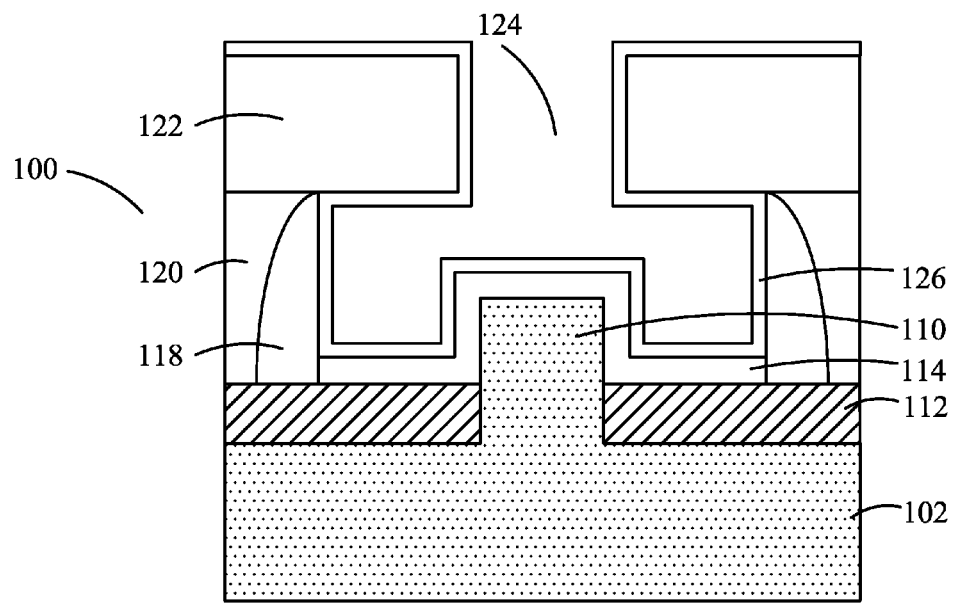

FIG. 9 illustrates the formation of a liner 126 in opening 124. Liner 126 may be formed of titanium nitride, tantalum nitride, titanium aluminum, and the like. Liner 126 may be formed, for example, by chemical vapor disposition (CVD), plating, atomic layer disposition (ALD), or another suitable technique. In certain embodiments, liner 126 may have a thickness in the range of about 3 Å to about 20 Å. Liner 126 covers the lateral surfaces and the sidewalls of opening 124. Liner 126 may further cover the top surface of ILD 122. Liner 126 is a single layer that serves both as a contact barrier layer and a work function metal. That is, liner 126 induces charge in the fin 110 when finFET 100 is turned on. At the same time, liner 126 prevents diffusion of metallic elements of a gate contact (formed in subsequent process steps) into the surrounding dielectric layers. It was observed in existing finFETs that contact barrier layers and the work function metals may be formed of the same material (e.g., titanium nitride, tantalum nitride, or titanium aluminum). Therefore, a work function metal and contact barrier may be merged into a single liner.

The merging of a contact barrier layer with a work function metal in liner 126 eliminates a high-resistance layer in finFET 100. Therefore, the overall contact resistance of finFET 100 is reduced.

Figure 10:
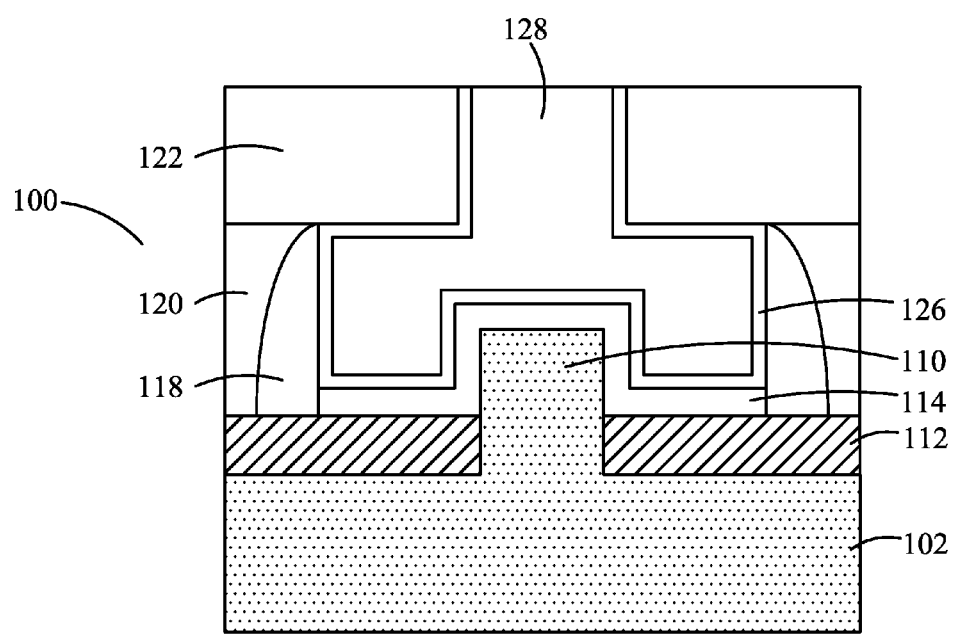

FIG. 10 illustrates the formation of contact 128 in opening 124. Opening 124 is filled to create contact 128. Contact 128 may be formed of tungsten, aluminum, or copper, although other metallic materials may be used as well. Contact 128 and liner 126 may undergo a CMP to remove excess portions of liner 126 over second ILD 122. The CMP also results in the top surface of contact 128 being level with the top surface of ILD 122. Liner 126 acts as a barrier layer and helps prevent diffusion of the metallic elements of contact 128 into second ILD 122. Simultaneously, liner 126 acts as a work function metal.

Contact 128 has a relatively low resistance compared to liner 126. Furthermore, portions of contact 128 in first ILD 120 act as portion of a gate electrode in a traditional finFET structure. That is, the portions of contact 128 in ILD 120 act as a signal metal for finFET 100. Therefore, contact 128 is both a gate contact and part of the gate electrode in finFET 100. Gate dielectric 114, liner 126 and contact 128 collectively form a gate, gate contact, and gate contact barrier in finFET 100. Although finFET 100 is shown as being a single-fin finFET (i.e., the gate is formed over a single fin), various embodiments may also be applied to a multi-fin finFET.

In accordance with an embodiment, an integrated circuit (IC) structure includes a substrate and a semiconductor strip over and connected to the substrate. A top portion of the semiconductor strip forms a fin. The IC structure further includes a first inter-layer dielectric (ILD) over the substrate and a second ILD over the first ILD. The fin extends into the first ILD, but the fin does not extend into the second ILD. A liner extends from a top surface of the second ILD, into the first ILD, and over a top surface and sidewalls of the fin. A signal metal in the first ILD the fine and a gate contact in the second ILD over and connected to the signal metal are also included in the IC structure. The liner extends between the signal metal and the fin, and the liner covers sidewalls of the gate contact. The gate contact and the signal metal form an uninterrupted metallic region.

In accordance with another embodiment, an integrated circuit (IC) structure includes a substrate. A portion of the substrate extends upwards, forming a fin. A gate dielectric is disposed over a top surface and sidewalls of the fin. A liner overlays the gate dielectric. An uninterrupted metallic feature over a portion of the liner overlaying the gate dielectric. The liner extends from a top surface of the uninterrupted metallic feature and covers sidewalls of the metallic feature. Furthermore, the gate dielectric, liner, and uninterrupted metallic feature collectively form a gate, a gate contact barrier, and a gate contact.

In accordance with yet another embodiment, a method for forming an integrated circuit (IC) structure includes etching a substrate to form a fin, forming a gate dielectric over the top surface and at least portions of sidewalls of the fin, forming dummy gate over the gate dielectric, forming an interlayer dielectric (ILD) over the dummy gate, patterning the ILD to create an opening in the ILD, exposing a portion of the dummy gate, removing the dummy gate, expanding the opening to expose the gate dielectric, forming a liner covering a bottom surface and sidewalls of the opening, and filling the opening with a metallic material. The gate dielectric, liner, and metallic material collectively form a gate, gate contact barrier, and gate contact.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated circuit (IC) structure comprising:
a substrate;
a semiconductor strip over and connected to the substrate, wherein a top portion of the semiconductor strip forms a fin;
a first inter-layer dielectric (ILD) over the substrate, wherein the fin extends into the first ILD;
a second ILD over the first ILD, wherein the fin does not extend into the second ILD;
a liner extending from a top surface of the second ILD, into the first ILD, and over a top surface and sidewalls of the fin;
a signal metal in the first ILD over the fin, wherein a first portion of the liner is between the signal metal and the fin, and wherein a second portion of the liner is disposed on a top surface of the signal metal;
a gate spacer in the first ILD; and
a gate contact in the second ILD, wherein the gate contact is over and connected to the signal metal, wherein the gate contact at least partially extends higher than the gate spacer, wherein the liner covers sidewalls of the gate contact, and wherein the gate contact and the signal metal form an uninterrupted metallic region.

2. The IC structure of claim 1, wherein the IC structure does not comprise a separate gate contact barrier or a separate work function metal.

3. The IC structure of claim 1, further comprising a gate dielectric under the liner and over the top surface and sidewalls of the fin.

4. The IC structure of claim 3, further comprising an interfacial layer between the gate dielectric and the fin.

5. The IC structure of claim 1, further comprising a first and a second dielectric region disposed on opposite sides of the semiconductor strip between the first ILD and the substrate, wherein the portion of the semiconductor strip forming the fin extends over the first and the second dielectric region.

6. The IC structure of claim 1, wherein the liner is formed of titanium nitride, tantalum nitride, titanium aluminum, or a combination thereof.

7. The IC structure of claim 1, wherein the uninterrupted metallic region is formed of tungsten, aluminum, copper, or a combination thereof.

8. An integrated circuit (IC) structure comprising:
a substrate, wherein a portion of the substrate extends upwards, forming a fin;
a gate dielectric over a top surface and sidewalls of the fin;
a liner overlaying the gate dielectric; and
an uninterrupted metallic feature over a portion of the liner overlaying the gate dielectric, wherein the liner extends from a top surface of the uninterrupted metallic feature and covers sidewalls of the uninterrupted metallic feature, wherein the liner at least partially covers a top surface of the uninterrupted metallic feature, and wherein the gate dielectric, liner, and uninterrupted metallic feature collectively form a gate, a gate contact barrier, and a gate contact.

9. The IC structure of claim 8, wherein the gate does not comprise a separate work function metal, and the gate contact does not comprise a separate gate contact barrier.

10. The IC structure of claim 8, further comprising an interfacial layer between the fin and the gate dielectric.

11. The IC structure of claim 8, wherein the liner is formed of titanium nitride, tantalum nitride, or a combination thereof.

12. The IC structure of claim 8, wherein the uninterrupted metallic feature is formed of tungsten, aluminum, copper, or a combination thereof.

13. The IC structure of claim 8, wherein the gate dielectric is formed of silicon oxide, silicon nitride, a dielectric having a high-k value, or a combination thereof.

14. The IC structure of claim 8 further comprising a first inter-layer dielectric (ILD) over the substrate, wherein the fin extends into the first ILD, and wherein the gate is disposed in the first ILD.

15. The IC Structure of claim 14 further comprising a second ILD over the first ILD, wherein the fin does not extend into the second ILD, and wherein the gate contact is disposed in the second ILD.

16. The IC structure of claim 8 further comprising a first and a second dielectric region disposed on opposite sides of the fin, wherein the portion of the fin extends over the first and the second dielectric region.

17. An integrated circuit (IC) structure comprising:
a substrate comprising a portion extending upwards forming a fin;
a gate over the substrate and extending along sidewalls of the fin, wherein the gate comprises:
a work function metal; and
a signal metal over the work function metal;
a gate contact over the gate, wherein the gate contact and the signal metal form an uninterrupted metallic region;
a gate contact barrier disposed along sidewalls of the gate contact, wherein the gate contact barrier and the work function metal are connected and formed of a same material, and wherein the work function metal and the gate contact barrier form a liner at least partially covering a top surface of the signal metal; and
a gate spacer on a sidewall of the gate, wherein the gate contact at least partially extends higher than the gate spacer.

18. The IC structure of claim 17, wherein the gate further comprising a gate dielectric disposed between the substrate and the work function metal, the gate dielectric is on a top surface and sidewalls of the fin.

19. The IC structure of claim 17, wherein the same material of the work function metal and the gate contact barrier comprises titanium nitride, tantalum nitride, titanium aluminum, or a combination thereof.

20. The IC structure of claim 17, wherein the liner further covers sidewalls of the signal metal.

* * * * *